United States Patent
Devaney, II et al.

(10) Patent No.: US 6,917,787 B2
(45) Date of Patent: Jul. 12, 2005

(54) SYSTEM AND METHOD FOR SUPERHETERODYNE FREQUENCY MULTIPLICATION SIGNAL EXPANSION TO ACHIEVE A REDUCED BANDWIDTH FREQUENCY OR PHASE MODULATION COMMUNICATION CHANNEL

(76) Inventors: Patrick Owen Devaney, II, 1179 Santa Olivia Rd., Chula Vista, CA (US) 91913; Alan Jack Herr, 5519 Clairemont Mosa Blvd. #284, San Diego, CA (US) 92117

( * ) Notice: Subject to any disclaimer, the term of this patent is extended or adjusted under 35 U.S.C. 154(b) by 410 days.

(21) Appl. No.: 10/264,397

(22) Filed: Oct. 4, 2002

(65) Prior Publication Data

US 2003/0095201 A1 May 22, 2003

Related U.S. Application Data

(60) Provisional application No. 60/327,836, filed on Oct. 6, 2001.

(51) Int. Cl.$^7$ .............................. H04B 7/00; H04B 1/00; H04B 1/26
(52) U.S. Cl. ........................... 455/70; 455/72; 455/205; 455/215; 455/315; 455/323; 455/336; 375/320; 375/324
(58) Field of Search .......................... 455/70, 72, 205, 455/207, 209, 214–215, 313–314, 323, 334, 336–337; 375/320, 324, 327

(56) References Cited

U.S. PATENT DOCUMENTS

| | | | |
|---|---|---|---|
| 4,238,783 A | 12/1980 | Miller | |
| 4,250,456 A | 2/1981 | Shinmyo et al. | |
| 4,601,048 A | 7/1986 | Ryan | |
| 4,675,881 A | 6/1987 | Chung | |
| 5,548,839 A | * 8/1996 | Caldwell et al. | ............ 455/313 |
| 5,783,967 A | 7/1998 | Takaya | |
| 6,205,184 B1 | * 3/2001 | Al-Eidan | ..................... 375/316 |
| 6,591,091 B1 | * 7/2003 | Vorenkamp et al. | ..... 455/179.1 |
| 2001/0031629 A1 | * 10/2001 | Elder et al. | .................. 455/324 |
| 2002/0142746 A1 | * 10/2002 | Li et al. | ..................... 455/307 |

* cited by examiner

Primary Examiner—Simon Nguyen
(74) Attorney, Agent, or Firm—Polster, Lieder, Woodruff & Lucchesi, L.C.

(57) ABSTRACT

The present disclosure provides a method and apparatus for communicating a base band signal via a communication channel that connects a transmitter to a receiver comprising the steps of modulating the base band signal into a low frequency deviation modulated signal, transmitting the low frequency deviation modulated signal with a transmitter, receiving the low frequency deviation modulated signal with a receiver, mixing the received signal to an intermediate frequency signal, multiplying the intermediate frequency signal by to a multiplied frequency signal, multiplying a reference signal having a frequency generally equal to the center frequency of the intermediate frequency signal by a multiple that is one greater than or one less than the multiplied frequency signal to create a reference multiplied frequency signal, subtracting the reference multiplied frequency signal from the multiplied frequency signal to generate a wide band frequency signal, and discriminating the wide band frequency signal to obtain the base band signal.

20 Claims, 9 Drawing Sheets

SYSTEM AND METHOD FOR SUPERHETERODYNE FREQUENCY MULTIPLICATION SIGNAL EXPANSION TO ACHIEVE A REDUCED BANDWIDTH FREQUENCY OR PHASE MODULATION COMMUNICATION CHANNEL

RELATED APPLICATIONS

This application claims the priority of U.S. Provisional Patent Application Ser. No. 60/327,836 filed Oct. 6, 2001, the contents of which are incorporated herein by reference.

BACKGROUND OF THE INVENTION

1. Field of Invention

The present invention relates to increasing the number of communication channels, or information per fixed frequency bandwidth. In particular, it relates to a systematic method of increasing the number of channels per fixed frequency bandwidth significantly reducing each individual channel's bandwidth by using a reduced bandwidth Frequency Modulation or Phase Modulation signal.

2. Related Art

With each year, the MW, SW, VHF, and UHF bands have become more congested with increased demands from cell phones, personal communications devices, and pagers. However, the available radio frequency bandwidths in the MW, SW, VHF, and UHF bands available to the communications user has not expanded due to regulations and restrictions imposed by governmental and international treaty restrictions. The present day communication bands are essentially filled to capacity using present day modulation techniques and channel spacing. With the growing demands for communications systems, there is increased competition for already crowded radio frequency bands.

In the past, manufacturers have moved to higher frequencies to find additional or available communications channel bandwidth. Further, in most industrialized countries, all of the economically viable radio frequencies are committed to specified communications channels and their corresponding spacing. Seeking higher frequencies also poses significant health problems that are known to exist at higher frequencies from radiated radio frequency energy.

The only solution to the congested communications radio spectrum is to increase the number of communication channels in each allotted radio frequency band. The obvious methodology is to use communications channel bandwidth compression techniques. One problem with many of the communications systems that uses narrower bandwidths are a sacrifice of sound qualities and increased bit error rates in data channels. Many of the remaining communications channel compression schemes require complex and expensive electronic implementation.

Thus, there is a need for communications channel bandwidth reduction techniques to allow information to be transmitted over communications channels with reduced bandwidth, while retaining relatively high sound quality and lower bit error rate in data channels.

SUMMARY OF THE INVENTION

The present invention provides for a more efficient utilization of the frequency spectrum, overcoming problems presented by the growing need for more communications channels in today's rapidly expanding communications market. The present invention overcomes the existing technical problems inherent in the present art, in today's current designs, and the techniques used in today's implementation of low frequency deviation modulation communications systems.

The present invention allows the use of bandwidth-reduced communications channels by providing a practical, economically efficient, and reproducible method of demodulating low deviation FM (Frequency Modulated) or PM (Phase Modulated) signals, while significantly increasing the SNR (Signal-to-Noise Ratio) of the demodulated signal. The reduced bandwidth reduces the noise power in the communications channel while maintaining the same signal power, thus the SNR (Signal-to-Noise Ratio) of the communications channel is improved. The increased SNR produces signals with increased clarity, significantly decreased BER (Bit Error Rate), and allows higher data rates while allowing the carrier channel spacing to be reduced. In particular, the invention's purpose is to use low deviation FM and PM communications channels (low deviation FM and PM RF transmitters) which occupy significantly less bandwidth compared to present art, thus allowing the use of more closely spaced communications channels. Furthermore, it allows an increase in the number of communications channels in a particular band segment while increasing SNR of the communications channel.

In accordance with the present invention, a, low deviation FM (Frequency Modulated) or PM (Phase Modulated) communications channel can be implemented, transmitting the signal in a reduced carrier frequency bandwidth; receiving the signal; mixing the received signal to an IF (Intermediate Frequency); and then expanding the low deviation FM or PM signal into a signal with a wider frequency deviation. The low deviation signal is expanded by subtracting the $N^{th}$ harmonic of the IF signal frequency from the long-term averaged $(N-1^{th})$ harmonic of the IF signal frequency, or an $(N-1^{th})$ harmonic of the IF reference signal frequency oscillator. The expanded frequency deviation FM or PM signal can be demodulated using conventional FM discriminators, or PM demodulators, to obtain the desired base band audio, video, or data information.

BRIEF DESCRIPTION OF THE DRAWINGS

The nature, advantages, and various features of the invention present itself more completely upon consideration of illustrative embodiments herewith, and described in graphic detail by the accompanying drawings.

DETAILED DESCRIPTION OF THE PREFERRED EMBODIMENTS

Figure 1:
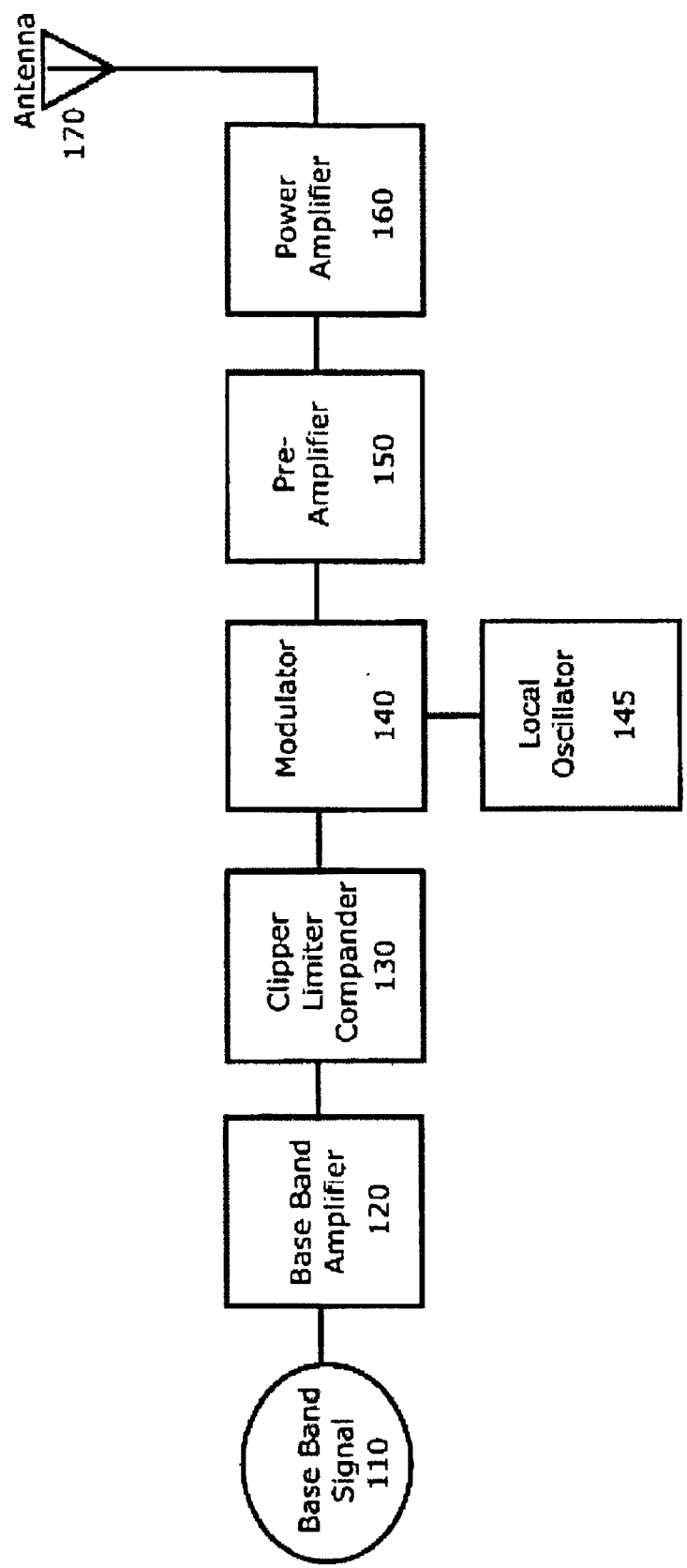
FIG. 1: Shows the block diagram of a preferred embodiment of a low frequency deviation FM or PM transmitter constructed in accordance with the present invention.

The present invention is not intended to be limited to the specific terminology used to demonstrate the methodology of the present invention. It is to be understood that each specific element includes all technical equivalents, which operate in a similar manner to accomplish a similar purpose. For the preferred embodiments describing the present invention illustrated in the drawings, specific terminology is employed for the sake of clarity.

A FM (Frequency Modulation) system is described in detail by way of example, although it is understood that the corresponding Phase Modulator components can be substituted for Frequency Modulation components to form an equivalent Phase Modulation (PM) system. Also, minor supporting functional elements (power supplies, etc.) well understood by those skilled in the art may be purposely omitted from the following discussion. The frequency multipliers are shown implemented using Phase Lock Loop circuits, but any frequency multiplier circuit is appropriate to implement the present invention.

In an FM transmitter, there are two physical phenomena that directly affect the frequency deviation of the transmitted radio frequency signal. The initial frequency deviation occurs in the frequency, or phase, modulator of the transmitter. In the frequency modulator, or phase modulator, the carrier frequency fluctuates, or deviates, or moves from its center frequency or carrier frequency by a delta frequency proportional to the amplitude (voltage) of the base band modulating signal. The second, additional frequency deviation occurs in the frequency multiplier/divider stages of the transmitter. The frequency deviation of the FM signal is multiplied/divided by the same ratio as the frequency multiplier/divider amplifier stages of the transmitter amplifier string. Thus, the cumulative effects of frequency deviation using a frequency modulator, or phase modulator, and succeeding multiplier/divider stages, allows a means for practically obtaining any desired numeric value for the FM carrier's center frequency and the FM carrier's corresponding frequency deviation in a FM transmitter.

It is well known for those skilled in the art, that merely decreasing, or narrowing, the deviation of an FM (or PM) signal at the transmitter results in significant SNR (Signal-to-Noise Ratio) increases until the modulation index reaches zero deviation. The limitations to obtaining those benefits has been an economic, or practical, method of receiving the reduced deviation FM or PM signal, and demodulating it without significant loss of the transmitted signal's sound quality.

Using prior technology to implement the FM receiver discriminator stage, the frequency deviation, at the conventional discriminator, of the signal's carrier frequency directly controls the quality of the sound output. As the frequency deviation of the FM, or PM, signal is increased (or the signal bandwidth increases) at the transmitter, the SNR (Signal-to-Noise Ratio) of the base band signal (i.e. music, data, voice, etc.) from the conventional frequency discriminator increases, and the resulting base band signal will have increased quality.

Conversely, when the frequency deviation, or bandwidth, of an FM signal is reduced at the transmitter, the SNR (Signal-to-Noise Ratio) decreases, the BER (Bit Error Rate) increases in the receiver, thus any attempt to reduce the individual FM signal bandwidth to allow more signals per fixed frequency bandwidth results in degraded base band signals at the receiver. The audio signal degrades in quality, and the error rate in digital signals dramatically increases. Thus, decreasing the frequency deviation at the transmitter is not viable using conventional FM discriminators and PM demodulators in the receiver.

The present invention allows FM transmitters and receivers, in which the frequency, or phase, modulation of the signal to be transmitted is generated at the transmitting side of a communication channel with a significantly reduced channel bandwidth, or very small corresponding frequency deviation. The frequency modulated signal is transmitted over the communication channel and received at the receiving side of the communication channel. The received signal is mixed with a local oscillator frequency to move the FM signal to the narrow band intermediate frequency. The frequency modulated IF (Intermediate Frequency) signal is applied to the superheterodyne frequency multiplication signal expansion circuit, which results in an FM signal with significantly expanded frequency deviation, while the FM signal remains centered at the IF frequency, along with a significantly improved SNR (Signal-to-Noise Ratio). The frequency deviation expansion, at the receiving side of the communication channel, is preferably accomplished by utilizing the superheterodyne frequency multiplication signal expansion circuit. Accordingly, the expanded frequency modulated signal can be further processed in any desired manner to obtain the transmitted base band signal. Thus, the reduced bandwidth, or reduced frequency deviation, FM receiver can reproduce high quality base band audio signals, or digital data signals, with low BER (Bit Error Rate) over a bandwidth limited communications channel.

Referring to the drawings, the invention is described with reference to an illustrative embodiments as follows:

FIG. 1 is a block diagram of the preferred embodiment of an FM (Frequency Modulated) transmitter. After it's base band input stage (FIG. 1-110) (e.g. a Microphone, Digital Data, etc.), the FM or PM transmitter includes: a base band amplifier (FIG. 1-120) followed by a limiter/clipper/compander (FIG. 1-130); succeeded by a modulator stage (FIG. 1-140) (i.e. an FM modulator) with it's associated carrier, or local, oscillator (FIG. 1-145). Finally, the completed modulator stage (FIG. 1-140) signal output drives a pre-amplifier (FIG. 1-150), followed by a power amplifier (FIG. 1-160), which then drives a suitable antenna (FIG. 1-170), or other communication channel interface (i.e. fiber optic cable).

Significantly in accordance with the present invention, the frequency deviation of the transmitted FM signal is limited (i.e. narrowed or reduced), to produce a small carrier frequency deviation resulting in a very narrow channel frequency bandwidth for the output, or transmitting, signal of the FM transmitter or PM transmitter.

Figure 2:
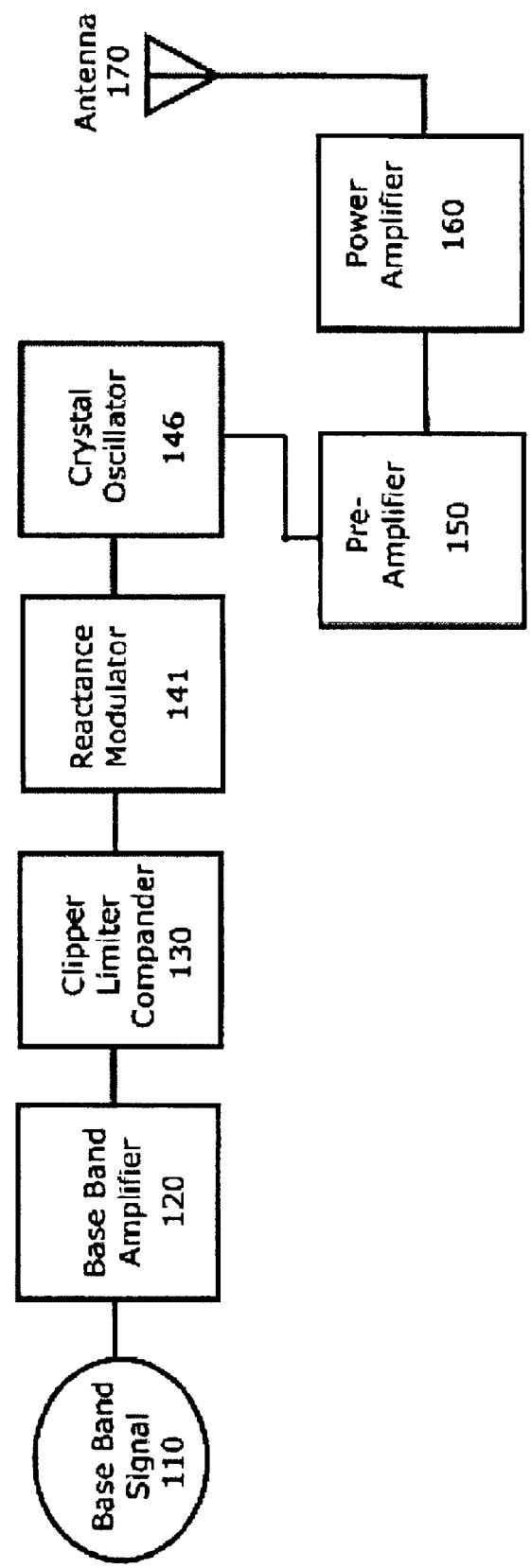
FIG. 2: Shows the block diagram of an alternative embodiment of a low frequency deviation FM or PM transmitter constructed in accordance with the present invention.

FIG. 2 shows a block diagram of an alternative embodiment of the FM transmitter. By way of example, a frequency modulation transmitter (i.e. FM transmitter) is described herein. Most elements in this embodiment are direct equivalents to those described in the preferred embodiment of the FM transmitter shown in FIG. 1, and are not repetitively described. In FIG. 2, the FM carrier modulator is implemented using a controlled reactance modulator (FIG. 2-141), in association with a piezoelectric crystal, or LC, oscillator (FIG. 2-146).

Figure 3:
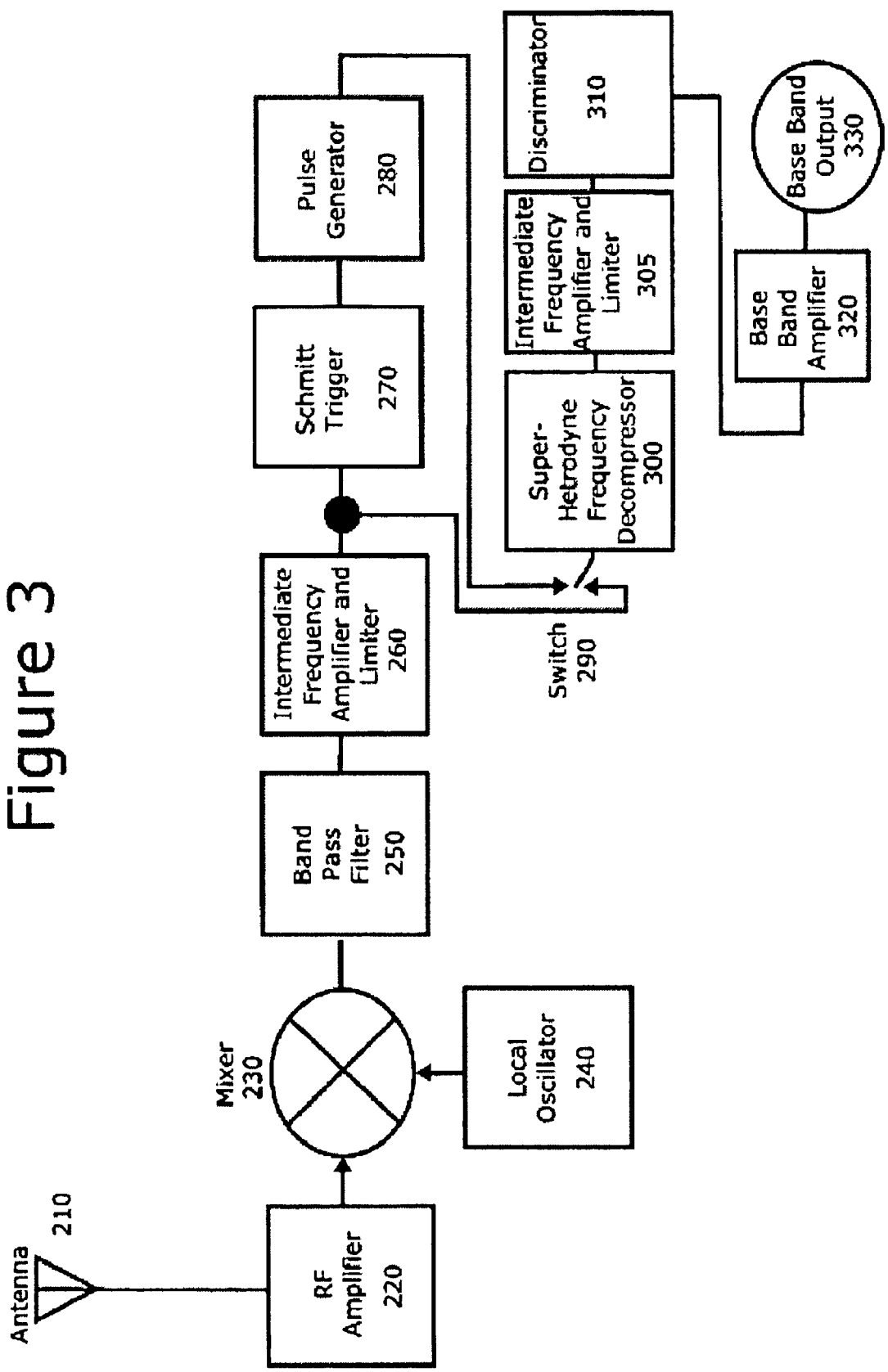
FIG. 3: Shows the block diagram of a preferred embodiment of a low frequency deviation FM or PM receiver constructed in accordance with the present invention.

FIG. 3 shows a block diagram of the preferred embodiment of the FM receiver for receiving the narrow frequency deviation FM signals transmitted from the FM transmitter according to FIGS. 1 AND 2. The receiver includes a suitable antenna (FIG. 3-210), or other communication channel interface (i.e. fiber optic cable); followed by an RF amplifier (FIG. 3-220); followed by an RF mixer (FIG. 3-230) with its associated local oscillator stage (FIG. 3-240) to down-convert the received FM or PM signal into a suitable IF (Intermediate Frequency) signal frequency. The completed RF mixer stage (FIG. 3-230) is followed by a band pass filter (FIG. 3-250) centered on the IF signal frequency. The band pass filter (FIG. 3-250) removes the unwanted mixer image, and any DC component from the IF (Intermediate Signal) signal. The band pass filter (FIG. 3250) is succeeded by an IF (Intermediate Frequency) amplifier/limiter (FIG. 3-260). The IF amplifier/limiter eliminates all of the amplitude variations from the IF signal. Subsequently, the IF amplifier/limiter (FIG. 3-260) is followed by a Schmitt Trigger (FIG. 3-270). The Schmitt Trigger selects a triggering level (i.e. voltage or magnitude) to minimize noise superimposed up on the IF (Intermediate Frequency) signal. Upon reaching the desired switching level, the Schmitt Trigger (FIG. 3-270) emits a pulse to trigger the following pulse generator (FIG. 3-280). The pulse generator emits pulses with a duration of approximately ½ the period of the center IF (Intermediate Frequency) carrier frequency. Next, the switch (FIG. 3-290) selects either the pulse stream from the pulse generator (FIG. 3-280), or the output of the IF (Intermediate Frequency) amplifier/limiter (FIG. 3-260). The switch (FIG. 3-290) is followed by the superheterodyne frequency multiplication signal expansion circuit stage (FIG. 3-300), which expands the frequency deviation of the signal in-place (i.e. in the frequency spectrum). The preferred embodiment of the superheterodyne frequency multiplication signal expansion circuit is described in FIG. 7, and the alternative embodiment is described in FIG. 8 and FIG. 9. The superheterodyne frequency multiplication signal expansion circuit stage (FIG. 3-300) is followed by an IF (Intermediate Frequency) amplifier/limiter (FIG. 3-305). This second IF amplifier/limiter eliminates all amplitude variations from the processed signal, which is followed by a conventional FM discriminator (FIG. 3-310). The received low deviation FM signal at FIG. 3-210 has thus, been expanded to a conventional frequency deviation by the superheterodyne frequency multiplication signal expansion circuit at FIG. 3-300. The processed FM signal, having been expanded to normal frequency deviations, is easily decoded by a conventional FM discriminator centered on the IF signal center frequency. The conventional FM discriminator reproduces the base band (audio or digital) signal. The frequency discriminator (FIG. 3-310) is followed by a base band amplifier (FIG. 3-320), and subsequently to the desired base band output device (FIG. 3-330) (i.e. conventional audio equipment including a speaker, or conventional digital equipment including a modem to demodulate the digital signal).

Figure 7:
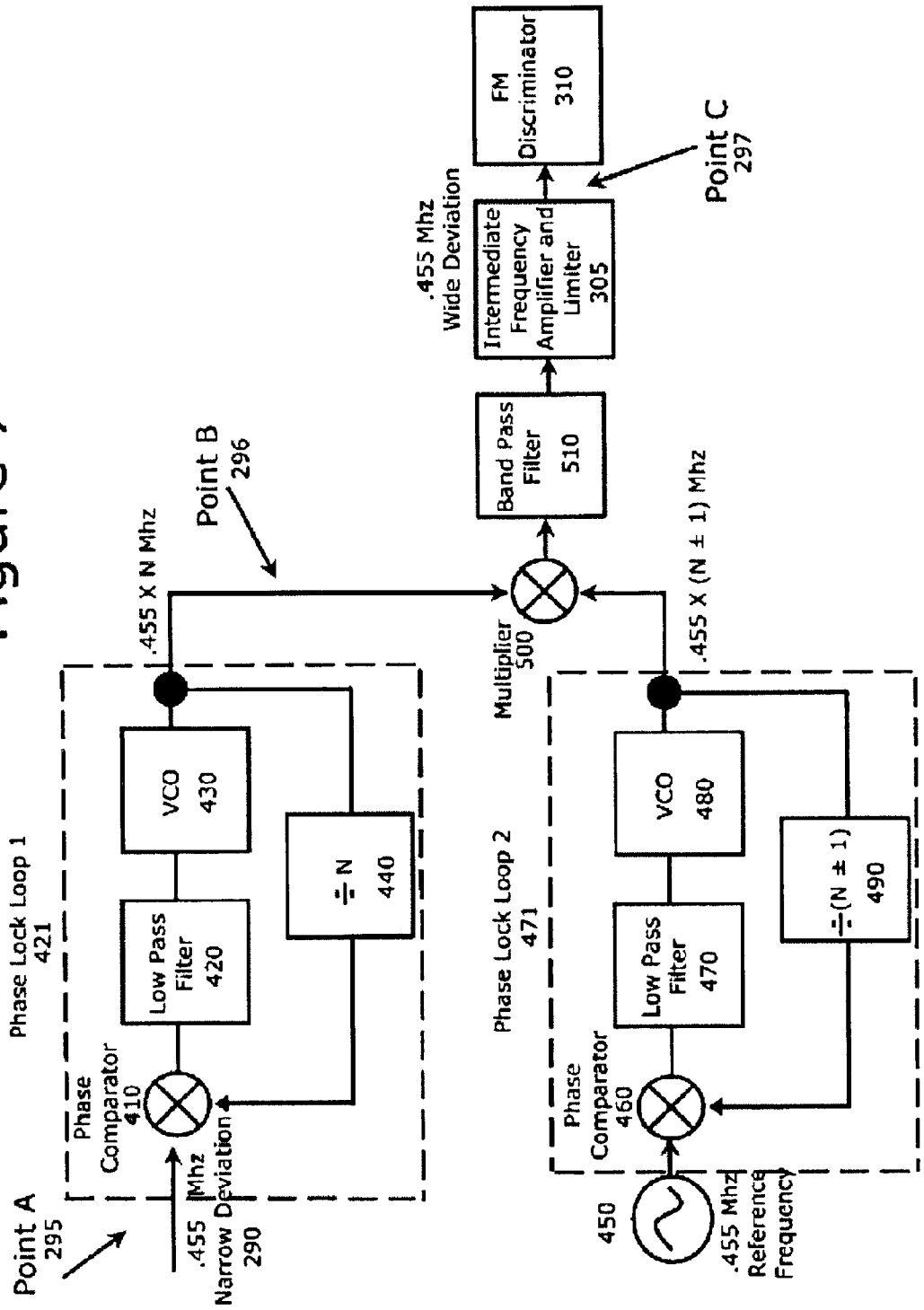
FIG. 7: Shows the block diagram of a preferred embodiment of a low frequency deviation FM or PM superheterodyne frequency multiplication signal expansion circuit constructed in accordance with the present invention.
Figure 8:
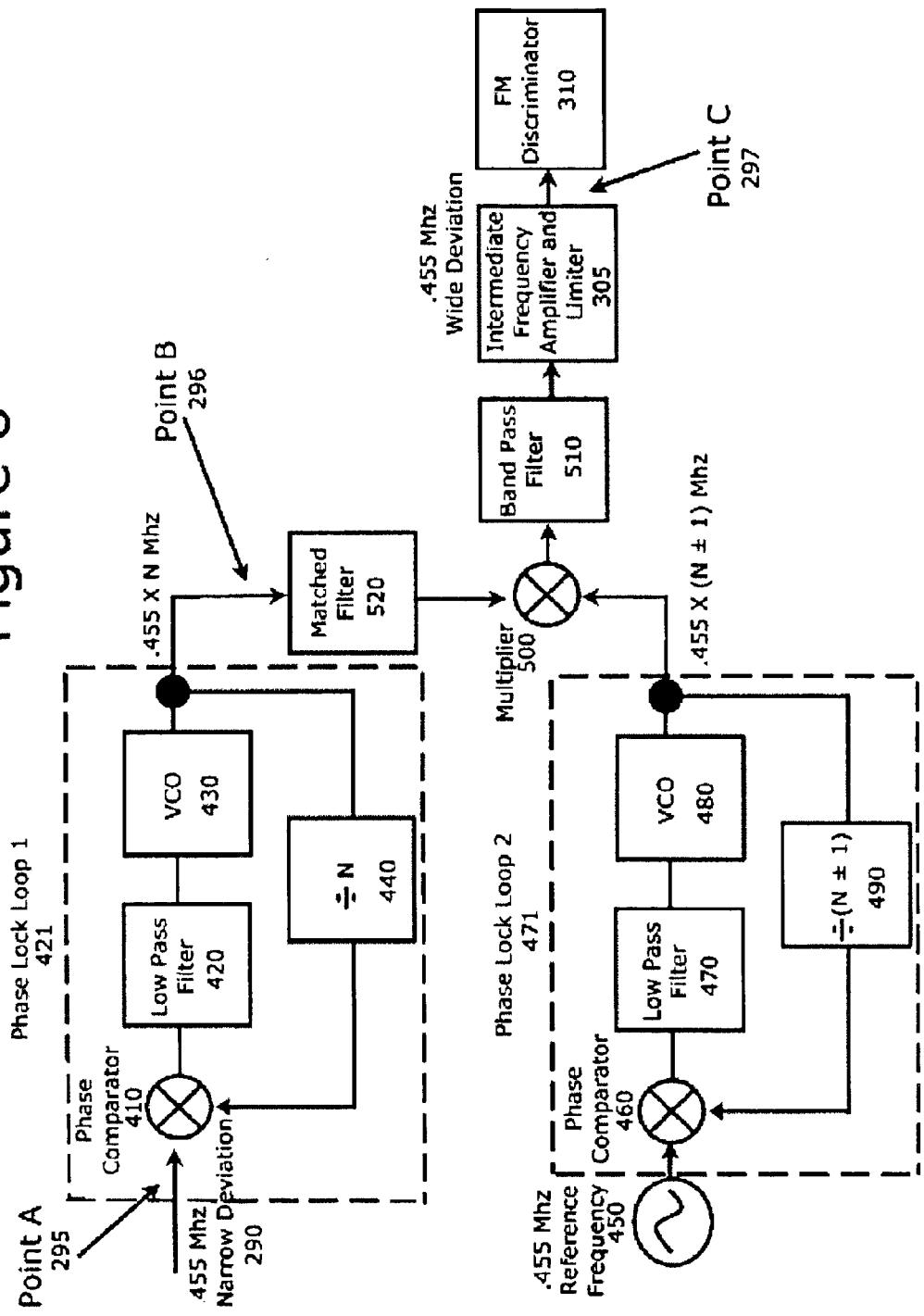
FIG. 8: Shows the block diagram of an alternative embodiment of a low frequency deviation FM or PM superheterodyne frequency multiplication signal expansion circuit using matched filters constructed in accordance with the present invention.
Figure 9:
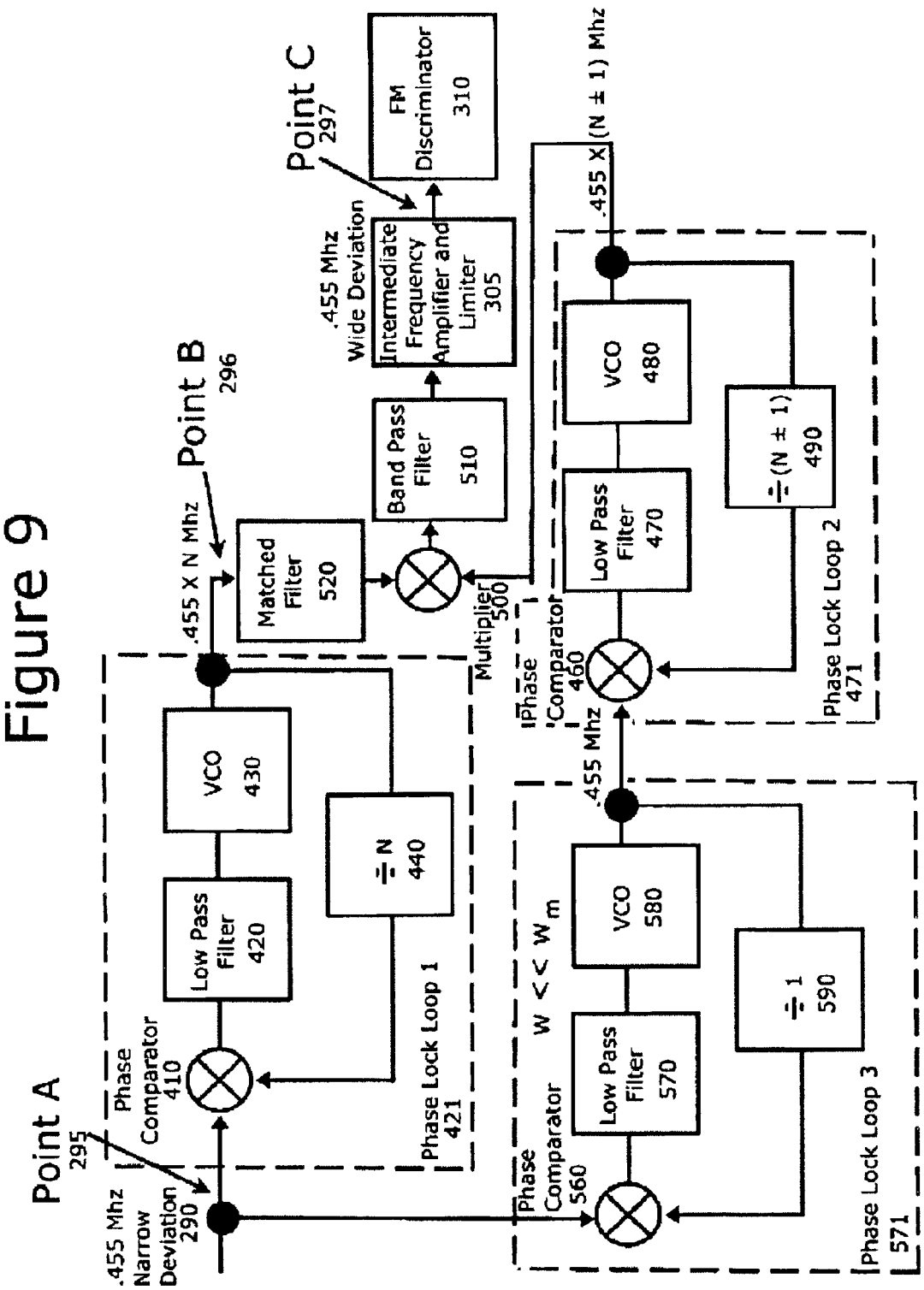
FIG. 9: Shows the block diagram of a preferred embodiment of a low frequency deviation FM or PM superheterodyne frequency multiplication signal expansion circuit with automatic frequency tracking and matched filters constructed in accordance with the present invention.

In accordance with a preferred embodiment of the invention, the receiver includes a superheterodyne frequency multiplication signal expansion circuit to multiply the frequency deviation of the IF (Intermediate Frequency) low deviation FM signal to generate an expanded frequency deviation FM signal centered on the original IF (Intermediate Frequency). The superheterodyne frequency multiplication signal expansion circuit shown in FIG. 7 is a preferred embodiment, and an alternative embodiment of the superheterodyne frequency multiplication signal expansion circuit is shown in FIG. 8. The superheterodyne frequency multiplication signal expansion circuit shown in FIG. 9 is a preferred embodiment with the implementation of the automatic carrier alignment circuit.

It is an advantage of the preferred embodiment of the invention that, when the expanded narrow frequency deviation signal is applied to the FM discriminator (FIG. 3-310), the FM discriminator demonstrates significantly improved FM frequency discrimination properties with a better SNR (Signal-to-Noise Ratio) compared with the frequency discrimination of a non-expanded FM signal. Accordingly, the combination of a low deviation FM modulator transmitter (FIG. 1 or 2) with a receiver containing the superheterodyne frequency multiplication signal expansion circuit (i.e. FIG. 3-300) provides a significant advantage over known systems.

Figure 4:
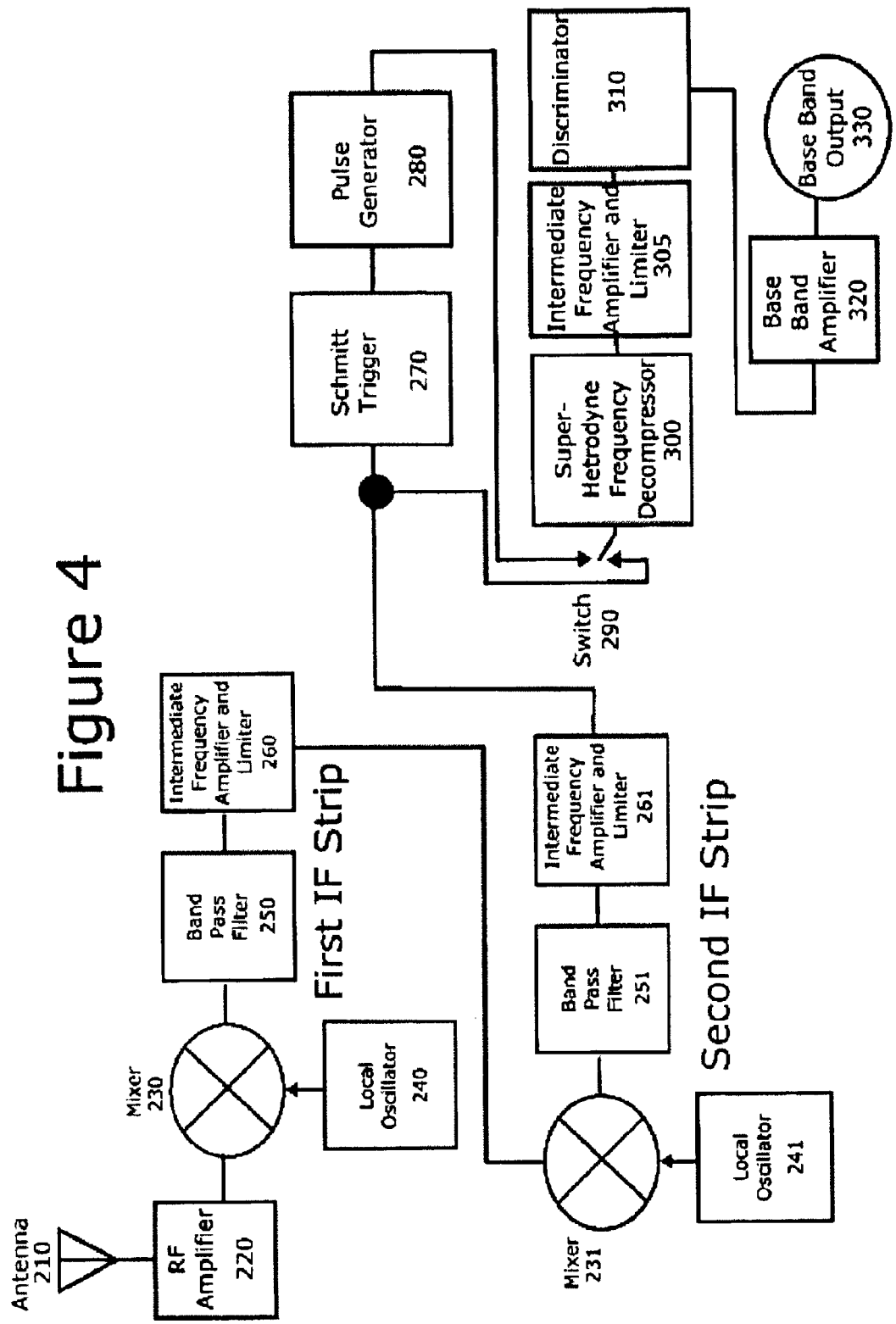
FIG. 4: Shows the block diagram of an alternative embodiment of a low frequency deviation FM or PM receiver constructed in accordance with the present invention.

FIG. 4 shows a block diagram of an alternative embodiment of an FM receiver for receiving the narrow frequency deviation FM signals transmitted from the FM transmitter according to FIG. 1 or 2. Most elements in this embodiment are direct equivalents to those in the preferred embodiment of the FM receiver shown in FIG. 3, and are not repetitively described. The increased dynamic range of the receiver, and out-of-band signal rejection, is implemented using a double conversion superheterodyne IF (Intermediate Frequency) scheme. A second IF (Intermediate Frequency) strip is added to the FM receiver using the following elements:

The output of the first IF (Intermediate Frequency) amplifier/limiter (FIG. 4-260), is followed in the alternative embodiment by a RF mixer (FIG. 4-231), with an associated local oscillator (FIG. 4-241) to down-convert the first IF (Intermediate Frequency) signal frequency into a suitable second IF (Intermediate Frequency) signal frequency. The completed RF mixer stage (FIG. 4-231) is followed by a band pass filter (FIG. 4-251) centered on the second IF (Intermediate Frequency) signal frequency. The second IF (Intermediate Frequency) band pass filter removes the unwanted mixer image and any DC component from the second IF (Intermediate Frequency) signal. The second IF (Intermediate Frequency) frequency band pass filter (FIG. 4-251) is succeeded by the second IF (Intermediate Frequency) amplifier/limiter (FIG. 4-261). The second IF (Intermediate Frequency) amplifier/limiter eliminates all remaining traces of the amplitude variations from the processed signal. The second IF (Intermediate Frequency) strip removes interference from out-of-band signals and the first IF (Intermediate Frequency) strips mixer images.

Figure 5:
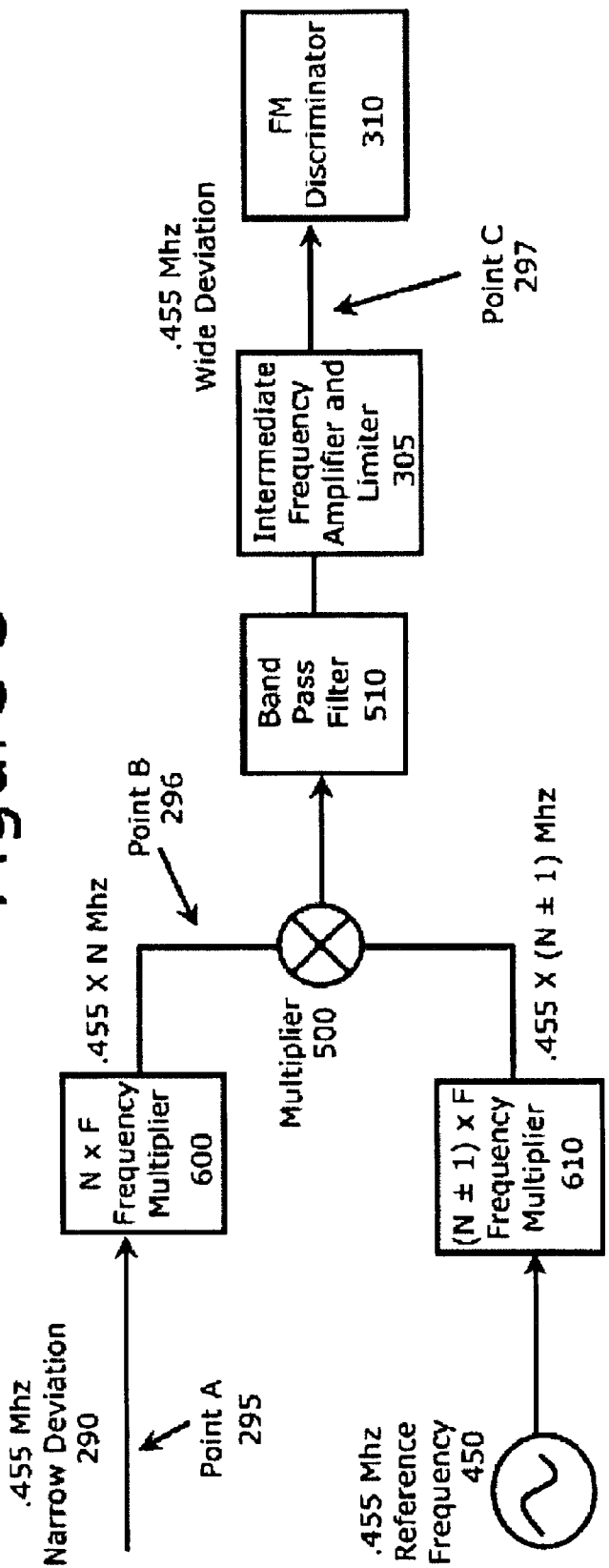
FIG. 5: Shows the functional diagram of a preferred embodiment of a low frequency deviation FM or PM superheterodyne frequency multiplication signal expansion circuit constructed in accordance with the present invention.

FIG. 5 shows the functional diagram of a preferred embodiment of a low frequency deviation FM superheterodyne frequency multiplication signal expansion circuit. The superheterodyne frequency multiplication signal expansion circuit performs the in-place (i.e. in the frequency spectrum) frequency deviation multiplication. The narrow band FM signal "F" (FIG. 5-290), further characterized as Point A (FIG. 5-295), is multiplied N times (N×F) by the frequency multiplier (FIG. 5-600), resulting in an expanded frequency deviation signal at the $N^{th}$ harmonic of the IF (Intermediate Frequency) signal, further characterized as Point B (FIG. 5-296). A reference frequency centered at the IF (Intermediate Frequency) carrier frequency (FIG. 5-450) is multiplied ((N±1)×F) times by the second frequency multiplier (FIG. 5-610). The resulting multiplied frequencies from the stages described in FIG. 5-600 and FIG. 5-610 respectively, are fed into the algebraic multiplier (FIG. 5-500). The difference frequency (i.e. [N−[N±1]]F=1×F) from the algebraic multiplier (FIG. 5-500) is followed by a band pass filter (FIG. 5-510) centered on the IF (Intermediate Frequency) strips center frequency. The resulting FM signal at the output of the band pass filter (FIG. 5-510) is at the center of the original IF (Intermediate Frequency) center frequency, with the frequency deviation, or bandwidth, of the original FM IF (Intermediate Frequency) signal frequency, multiplied or expanded by N. The band pass filter (FIG. 5-510) is followed by the IF (Intermediate Frequency) amplifier/limiter (FIG. 5-305), which eliminates all amplitude variations from the IF (Intermediate Frequency) signal, and is further characterized by Point C (FIG. 5-297). The output from the IF (Intermediate Frequency) amplifier/limiter (FIG. 5-305) is followed by a conventional FM discriminator (FIG. 5-310).

Figure 6:
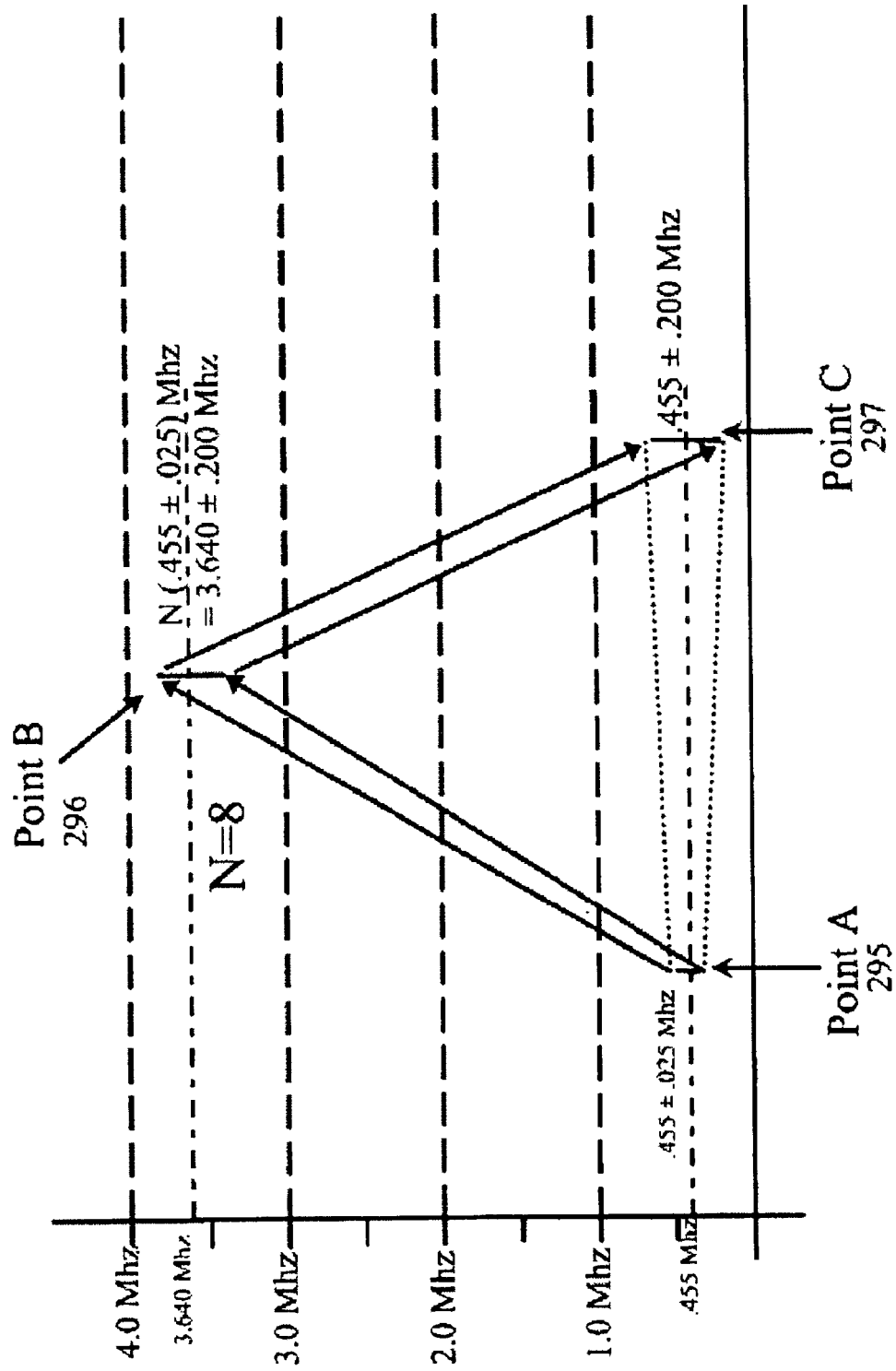
FIG. 6: Shows the frequency domain translation details of the in-place frequency deviation multiplication in accordance with the present invention.

FIG. 6 shows the preferred embodiment's frequency domain FM signal translation shown in FIG. 5, of the in-place frequency deviation multiplication in accordance with the present invention. The example in FIG. 6 uses a multiplication factor of eight (8). Point A (FIG. 6-295) shows the 25 kHz bandwidth of the low deviation IF (Intermediate Frequency) signal frequency centered at 0.455 MHz. Point B (FIG. 6-296) shows the expanded bandwidth of the expanded FM signal at its $N^{th}$ harmonic. The resulting frequency is centered at 3.640 MHz, with a bandwidth of 200 kHz. Both the center frequency and the frequency deviation of the FM (or PM) signal are multiplied by the multiplication factor of eight (N=8) in the frequency multiplier (FIG. 5-600). The reference frequency centered at the IF (Intermediate Frequency) strip's signal frequency, in this case 0.455 MHz, is multiplied by seven (i.e. N−1, or 8−1=7) in the reference frequency multiplier stage (FIG. 5-610) to 3.185 MHz. Subsequently, the two multiplied signals are further algebraically multiplied by each other in the third multiplier stage (FIG. 5-500), with the resulting difference frequency of 0.455 MHz. The resulting difference frequency at Point C (FIG. 6-297) is centered at the original IF (Intermediate Frequency) center frequency of 0.455 MHz, with, a frequency deviation of 200 kHz, or in our example 8 times the original frequency deviation.

FIG. 7 shows a block diagram of the preferred embodiment to implement an exemplary Phase Lock Loop for the superheterodyne frequency multiplication signal expansion circuit stage in FIG. 3 (i.e. FIG. 3-300) and FIG. 4 (i.e. FIG. 4-300) to expand narrow frequency deviation FM (or PM) modulation signals as transmitted from the transmitter according to FIG. 1 or 2. The narrow band FM signal from the switch in FIG. 3 (i.e. FIG. 3-290), and FIG. 4 (i.e. FIG. 4-290) provides the input (IF (Intermediate Frequency) FM carrier) of the Phase Lock Loop 1 (FIG. 7-421), formed from the phase comparator (FIG. 7-410), low pass filter (FIG. 7-420), voltage controlled oscillator (FIG. 7-430), and the frequency divider (FIG. 7-440). According to the circuit of the Phase Lock Loop 1 (FIG. 7-421) in FIG. 7, the voltage controlled oscillator (FIG. 7-430), oscillates on the $N^{th}$ harmonic of the Phase Lock Loop 1 (FIG. 7-421) input frequency with N being limited to an integer number. The phase comparator (FIG. 7-410), compares the input signal (the IF (Intermediate Frequency) signal frequency, or 0.455 MHz in this example) with the voltage controlled oscillator (FIG. 7-430) output signal after it is divided by an integer number (i.e. 8 in our example) by the feedback divider (FIG. 7-440). The phase comparator (FIG. 7-410), is followed by a low pass filter (FIG. 7-420), then by the voltage controlled oscillator (FIG. 7-430). The output of the voltage controlled oscillator (FIG. 1-430) is connected to an input of the following multiplier (FIG. 7-500).

A reference frequency oscillator (FIG. 7-450), centered at the IF (Intermediate Frequency) signal frequency, provides the input of the Phase Lock Loop 2 (FIG. 7-471) formed from the mixer stage (FIG. 7-460), the low pass filter (FIG. 7-470), the voltage controlled oscillator (FIG. 7-480), and the frequency divider (FIG. 7-490). According to the circuit of the Phase Lock Loop 2 (FIG. 7-471) in FIG. 7, the voltage controlled oscillator (FIG. 7-480) oscillates on the $(N±1^{th})$ harmonic of the Phase Lock Loop 2 (FIG. 7-471) input frequency (FIG. 7-450), with N being limited to an integer number.

The phase comparator (FIG. 7-460) compares the reference signal (i.e. the IF (Intermediate Frequency) frequency signal, or 0.455 MHz in this example) with the voltage controlled oscillator (FIG. 7480) output signal, after it is divided by a integer number (i.e. 7 in our example) by the feedback divider (FIG. 7-490). The phase comparator (FIG. 7-460) is followed by a low pass filter (FIG. 7-470), and then followed by the voltage controlled oscillator (FIG. 7-480). The output of the reference signal frequency voltage controlled oscillator (FIG. 7-480) is connected to an input of the following multiplier (FIG. 7-500).

The multiplier (FIG. 7-500) output frequencies are the sum, and the difference, of the frequency multiplied IF (Intermediate Frequency) and the frequency multiplied comparison, or reference, frequency. The multiplier (FIG. 7-500) is followed by a band pass filter (FIG. 7-510), with its band pass equal to the expanded bandwidth of the IF (Intermediate Frequency) FM signal, and its band pass centered on the original IF (Intermediate Frequency) signal frequency. The IF (Intermediate Frequency) FM signal at this point is at the original IF (Intermediate Frequency) signal frequency, and the frequency deviation and bandwidth have been multiplied by 8, as described in FIG. 5 and FIG. 6. The band pass filter is followed by an IF (Intermediate Frequency) amplifier/limiter (FIG. 7-305), to eliminate all amplitude variations from the signal, which is followed by a conventional FM discriminator (FIG. 7-310). Many elements in this embodiment are direct functional equivalents to those described in the preferred embodiment of the superheterodyne frequency multiplication signal expansion circuit shown in FIG. 5 and FIG. 6, and are not repetitively described here.

FIG. 13 shows a block diagram of an alternative embodiment of the superheterodyne frequency multiplication signal expansion circuit shown in FIG. 7 to receive narrow frequency deviation FM modulation signals as transmitted from the transmitter according to FIGS. 1 and 2. Most elements in this embodiment are direct equivalents to those in the preferred embodiment of the superheterodyne frequency multiplication signal expansion circuit shown in FIG. 7, and are not repetitively described. The out-of-band signal rejection, and inter-modulation products are improved using a matched filter. In the FIG. 8 embodiment, to reduce out-of-band signals, a matched filter (FIG. 8-520) is inserted between the voltage controlled oscillator (FIG. 8-430) and the input of the multiplier (FIG. 8-500). The matched filter operates at N times the IF (Intermediate Frequency) signal frequency, and has the bandwidth of the expanded FM signal. The removal of out-of-band frequencies, before the multiplier stage (FIG. 8-500), minimizes any intermodulation products produced by the multiplier that could fall inside the desired final IF (Intermediate Frequency) band pass frequency.

FIG. 9 shows a block diagram of an alternative embodiment of the superheterodyne frequency multiplication signal expansion circuit shown in FIG. 7 and FIG. 8 to receive a narrow frequency deviation FM modulated signals as transmitted from the transmitter according to FIG. 1 and FIG. 2, transmitted off the desired center frequency. Most elements in this embodiment are direct equivalents to those in the preferred: embodiment of the superheterodyne frequency multiplication signal expansion circuit shown in FIG. 7 and FIG. 8, and are not repetitively described. In the FIG. 9 embodiment, the superheterodyne frequency multiplication signal expansion circuit automatically tracks the FM carriers channel offset and automatically corrects for the carrier offset. In the embodiment shown in FIG. 3, FIG. 4, FIG. 5, FIG. 7, and FIG. 8, any error in tuning in the FM signals center frequency is multiplied by N. A small error in tuning the center frequency of the FM signal, from the switch described in (FIG. 3-290) and (FIG. 4-290), results in the output IF (Intermediate Frequency) FM signal's center frequency error being N times (i.e. N×Error) greater. A relatively small error in the receiver tuning of the received FM signal carrier results in an error that can move the output frequency of the superheterodyne frequency multiplication signal expansion circuit beyond the linear demodulation range of the following FM discriminator (FIG. 9-310). A Phase Lock Loop 3 (FIG. 9-571) is used to track the center frequency of the IF (Intermediate Frequency) FM signal to eliminate these technical limitations. The output of the tracking Phase Lock Loop 3 (FIG. 9-571) is used to generate the comparison frequency directly related to the center frequency of the received IF (Intermediate Frequency) FM signal.

The automatic carrier offset tracking circuit is implemented using Phase Lock Loop 3 (FIG. 19-571) consisting of elements phase comparator (FIG. 9-560), low pass filter (FIG. 9-570), voltage controlled oscillator (FIG. 9-580), and the frequency divider (FIG. 9-590). The IF frequency from the switch (FIG. 3-290) and (FIG. 4-290) provides the reference input of the phase lock loop. The phase comparator (FIG. 9-560) compares the IF frequency (0.455. MHz in this example) from the switch (FIG. 3-290) and (FIG. 4-290) with the voltage controlled oscillator (FIG. 9-580) output signal after it is divided by 1 by the feedback divider (FIG. 9-590). The phase comparator (FIG. 9560) is followed by a low pass filter (FIG. 9-570), followed by the voltage controlled oscillator (FIG. 9-580). The output of the voltage controlled oscillator (FIG. 9-580) is connected to the input of the Phase Lock Loop 2 (FIG. 9-471) that follows.

The low pass filter (FIG. 9-570) cut off frequency is significantly lower than the lowest frequency component of the transmitted base band signal (FIG. 1-110) and (FIG. 2-110). The low pass filter's low cut off frequency allows the Phase Lock Loop 3 (FIG. 9-571) to track any variations in the center frequency of the FM signal, and any variations in the tuning of the FM receiver caused by either improper tuning or variations in the local mixer oscillators (FIG. 3-240), (FIG. 4-240) and (FIG. 4-241). The automatic frequency tracking of the IF (Intermediate Frequency) FM signal center frequency insures the comparison frequency is always properly centered on the IF (Intermediate Frequency) signal center frequency. The proper centering of the expanded frequency deviation signal on the FM discriminator (FIG. 9-310) insures the FM discriminator (FIG. 9-310) is operating at its most linear center frequency. This insures the resulting base band signal (FIG. 3-330) and (FIG. 4-330) is high quality base band audio signals with high SNR (Signal-to-Noise Ratio), and a digital signal with a low BER (Bit Error Rate).

The embodiment of the present invention described above, uses the Phase Lock Loop 3 (FIG. 9-571) to extract the long-term average, or center frequency. The resulting frequency generated by the voltage controlled oscillator (FIG. 9-580) is the long-term, or center frequency, of the IF (Intermediate Frequency) FM signal. Thus, any frequency tuning errors, and mixer frequency errors, are eliminated.

The invention is not limited to the example frequencies mentioned above. The illustrated embodiments of the invention have the following feature(s):

Modulator-Transmitter:

Preferred embodiments of low frequency deviation FM transmitter according to the present invention incorporate the following features:

(1) The amplitude of the base band modulating signal is limited (i.e. designed) such that the modulated oscillator frequency deviation is limited, or controlled, thus the total frequency deviation of the transmitted frequency does not exceed a pre-selected bandwidth limit signal (i.e. 0.5 kHz for example). The soft limiting of the base band signal limits the frequency deviation of the signal without producing non-linearities that limit the fidelity (i.e. BER (Bit Error Rate)) of the low frequency deviation FM system.

(2) The matched filters and the band pass filters in the transmitter are designed to limit the frequency spectrum of the transmitted signal and to reduce out of band signals.

Receiver-Demodulator:

In order to receive the narrow bandwidth FM signal from the transmitter, preferred embodiments of FM receivers are in accordance with the present invention, preferably incorporating the following characteristics:

(1) the superheterodyne frequency multiplication signal expansion circuit in the receiver is designed so that the processed if (intermediate Frequency) signal is presented to the FM discriminator, expanded and centered, at the original input IF (Intermediate Frequency) frequency.

(2) The superheterodyne frequency multiplication signal expansion circuit automatically compensates for mistuning and local oscillator frequency variation.

(3) The pulse generator performs first order filtering to filter noise in the IF string.

(4) a superheterodyne frequency multiplication signal expansion circuit is incorporated before a conventional FM discriminator, to increase frequency deviations of the FM signal, and resulting increase in base band signal quality being especially desirable when implemented in the ultra-high frequency (UHF), very high frequency (VHF), short wave (SW), medium wave (MW), or long wave (LW) bands.

Thus, in summary, according to the present invention, narrow band FM communications channels are implemented by transmitting a signal with a low frequency deviation (i.e. 0.5 kHz for example). Preferably after the FM signal is converted down to an IF signal, the signal with the small frequency deviation is expanded in-place in the receiver by frequency multiplying (N) the IF converted signal, and subtracting a frequency multiplied (N−1) carrier representing the center, or carrier frequency, of the transmitted FM signal. As a consequence, the conventional bandwidth limitations of lower frequency deviation FM signals resulting in reduced SNR (Signal-to-Noise Ratio) and higher BER (Bit Error Rate) at the receiver are eliminated by the frequency deviation expansion in the receiver. The result is audio and digital base band signals with high SNR (Signal-to-Noise Ratio) and low BER (Bit Error Rate).

In accordance with the present invention, the number of channels of transmission with given frequency bandwidth can be increased, while the SNR (Signal-to-Noise Ratio) and BER (Bit Error Rate) can be simultaneously improved.

It will be appreciated by those skilled in the art that the embodiments described are merely illustrative, and that various modifications may be made which fall within the scope of the claims. The narrow bandwidth FM signal according to the invention can be implemented ranging from the long wave band (UT-band) to the microwave frequency bands, and the base band modulation can be, but not limited to, broadcasts in stereo, digital audio format, high definition television (digital video), fiber optic, and the like. It is therefore to be understood that, within the scope of the appended claims and their equivalents, the invention may be practiced otherwise than as specifically described.

What is claimed is:

1. A method for communicating a base band signal via a communication channel that connects a transmitter to a receiver, the method comprising:
    modulating the base band signal into a low frequency deviation modulated signal;
    transmitting the low frequency deviation modulated signal with a transmitter;
    receiving the low frequency deviation modulated signal with a receiver;
    mixing the received signal to an intermediate frequency signal;
    multiplying the intermediate frequency signal by a multiplied frequency signal;
    multiplying a reference signal having a frequency generally equal to the center frequency of the intermediate frequency signal by a multiple that is one greater than or one less than the multiplied frequency signal to create a reference multiplied frequency signal;
    subtracting the reference multiplied frequency signal from the multiplied frequency signal to generate a wide band frequency signal; and
    discriminating the wide band frequency signal to obtain the base band signal.

2. The method of claim 1 wherein the communication channel is the air.

3. The method of claim 1 wherein the communication channel is a terrestrial communications channels.

4. The method of claim 3 wherein the communication channel is a copper wire or a fiber optic wire.

5. The method of claim 1 wherein the step of multiplying the intermediate frequency signal by to a multiplied frequency signal further comprises the step of
    multiplying the intermediate frequency signal by to a multiplied frequency signal with a phase lock loop.

6. The method of claim 1 wherein the step of multiplying a reference signal having a frequency generally equal to the center frequency of the intermediate frequency signal by a multiple one greater or less than the multiplied frequency signal to create a reference multiplied frequency signal comprises the step of:
    multiplying a reference signal by a multiple that is one greater than or one less than the multiplied frequency signal with a phase lock loop.

7. The method of claim 1 wherein after the step of multiplying the intermediate frequency signal but before the step of subtracting the reference multiplied frequency signal from the multiplied frequency signal, the method further comprises the step of:
    filtering the multiplied frequency signal with a matched filter.

8. The method of claim 1 wherein the frequency for the reference signal is obtained by performing the step of:
    setting the reference signal frequency equal to the long term average of the intermediate frequency signal.

9. The method of claim 8 wherein the step of setting the reference signal frequency equal to the long term average of the intermediate frequency signal is accomplished by means of a phase lock loop.

10. An apparatus for receiving a low frequency deviation frequency modulated or phase modulated base band signal via a communication channel comprising:
    an input for receiving the low frequency deviation modulated signal from the communication channel;
    a mixer for mixing the received signal to an intermediate frequency signal;
    a first multiplier for multiplying the intermediate frequency signal by an integer value generate a multiplied frequency signal;
    a second multiplier for multiplying a reference signal having a frequency generally equal to the center frequency of the intermediate frequency signal by a multiple that is either one greater than, or one less than, the multiplied frequency signal to generate a reference multiplied frequency signal;
    subtracting the reference multiplied frequency signal from the multiplied frequency signal to generate a wide band frequency signal; and
    discriminating the wide band frequency signal to obtain an unmodulated base band signal.

11. The apparatus of claim 10 wherein the communication channel is the air.

12. The apparatus of claim 10 wherein the communication channel is a terrestrial communications channels.

13. The apparatus of claim 12 wherein the communication channel is a copper wire or a fiber optic wire.

14. The apparatus of claim 10 wherein the multiplier for multiplying the intermediate frequency signal by to a multiplied frequency signal further multiplies the intermediate frequency signal by to a multiplied frequency signal with a phase lock loop.

15. The apparatus of claim 10 wherein the multiplier for multiplying a reference signal having a frequency generally equal to the center frequency of the intermediate frequency signal by a multiple one greater or less than the multiplied frequency signal to create a reference multiplied frequency signal further multiplying a reference signal by a multiple that is one greater than or one less than the multiplied frequency signal with a phase lock loop.

16. The apparatus of claim 10 further comprise a matched filter for filtering the multiplied frequency signal.

17. The apparatus of claim 10 wherein the frequency for the reference signal is obtained by setting the reference signal frequency equal to the long term average of the intermediate frequency signal.

18. The apparatus of claim 17 wherein the frequency for the reference signal is obtained by setting the reference signal frequency equal to the long term average of the intermediate frequency signal by means of a phase lock loop.

19. A method for demodulating a narrow band frequency modulated or phase modulated signal comprising the steps of:

receiving the low frequency deviation modulated signal;

mixing the received signal to an intermediate frequency signal;

multiplying the intermediate frequency signal by to a multiplied frequency signal;

multiplying a reference signal having a frequency generally equal to the center frequency of the intermediate frequency signal by a multiple that is one greater than or one less than the multiplied frequency signal to create a reference multiplied frequency signal;

subtracting the reference multiplied frequency signal from the multiplied frequency signal to generate a wide band frequency signal; and discriminating the wide band frequency signal to obtain the base band signal.

20. The method of claim 19 further comprising the step of setting the reference signal frequency equal to the long term average of the intermediate frequency signal.

* * * * *